United States Patent [19]
Higgins, III

[11] Patent Number: 5,985,682
[45] Date of Patent: Nov. 16, 1999

[54] METHOD FOR TESTING A BUMPED SEMICONDUCTOR DIE

[75] Inventor: Leo Michael Higgins, III, Austin, Tex.

[73] Assignee: Motorola, Inc., Schaumburg, Ill.

[21] Appl. No.: 08/917,265

[22] Filed: Aug. 25, 1997

[51] Int. Cl.[6] ............................ H01L 21/66; G01R 21/26
[52] U.S. Cl. ............................... 438/10; 438/17; 324/765
[58] Field of Search ............................ 438/14, 17, 10; 324/754, 755, 765

[56] References Cited

U.S. PATENT DOCUMENTS

| | | | |
|---|---|---|---|
| 5,477,160 | 12/1995 | Love | 324/755 |
| 5,500,605 | 3/1996 | Chang | 324/755 |
| 5,880,590 | 3/1999 | Desai et al. | 324/757 |

Primary Examiner—Brian Dutton
Attorney, Agent, or Firm—Lee E. Chastain; Patricia S. Goddard

[57] ABSTRACT

A method for testing a bumped semiconductor die (14) is accomplished without excessively deforming the conductive bumps (200). In one form, testing is accomplished using a test contactor (12) which includes a deformable layer (204), such as an elastomer, which is patterned to include a plurality of openings (202) corresponding in pattern to the conductive bumps (200). The die is positioned next to the test contactor and the two are compressed together. The walls of the openings in the elastomeric material constrain the deformation of the conductive bumps in the X-Y plane due to the lateral pressure exerted on the sides of the conductive bumps. In a second form, a mechanical standoff (216) limits the extent to which the die and the test contactor can approach, thereby limiting the deformation in the Z-axis. In a third form, both elastomeric material and mechanical standoff act to constrain the deformation in the X-, Y-, and Z- axes.

24 Claims, 2 Drawing Sheets

METHOD FOR TESTING A BUMPED SEMICONDUCTOR DIE

FIELD OF THE INVENTION

The present invention relates generally to semiconductor manufacturing and testing, and more particularly to methods for testing semiconductor devices which have conductive bumps formed on a surface thereof.

BACKGROUND OF THE INVENTION

Flip-chip semiconductor devices continue to gain popularity in the semiconductor industry due to the reduced size or footprint of the device upon being mounted to a user's substrate. In flip-chip devices, a semiconductor die is flip-chip mounted (active side down) to the user substrate, and electrical connections are made between the user's substrate and the active circuitry of the die through a plurality of conductive bumps. Typically, the conductive bumps are pre-formed on the active surface of the semiconductor die. The conductive bumps can be made of solder, gold, a conductive epoxy, or the like, and can be formed by selective evaporation, plating, or using a lithographic patterning process.

Regardless of the bump material or the manner in which the bumps are formed, conductive bumps formed on the die have a tendency to become deformed prior to the time the user is ready to flip-chip mount the die to a substrate. A primary cause of bump deformation is that induced by testing the die. Testing the die, be it in the form of probe, functional test, or burn-in, involves physically contacting the conductive bumps of the die with some form of test contact, such as a probe needle, an array probe wire, a test pin, or the like. If the bump material is soft (e.g. in the case of gold or lead-tin solder bumps), deformation is more likely. Likewise, if testing is performed at an elevated temperature (e.g. above 70° C.) or for extended periods of time (e.g. over several hours), deformation is more likely.

Examples of problems associated with deformed bumps include the following: if deformed too badly 1) a bump can electrically short-circuit to a neighboring bump; 2) it can be difficult to connect the bump through a solder mask opening on the user's substrate; 3) it can be difficult to make adequate contact to a pad on the user's substrate; 4) a vision system can reject the bump as defective or may not be able to recognize the bump; 5) the deformation can lead to the creation of voids in the bump; 6) there may be insufficient standoff height between the die and the user substrate once attached; and 7) the mere appearance of the bump will cause the die to be rejected by the customer or user.

Prior art solutions to overcome the problems associated with deformed bumps are not cost-effective solutions. One solution is to expose the die to an elevated temperature reflow operation. For example, if using a high-lead solder (e.g. greater than 90% lead and less than 10% tin), a reflow at or above 300° C. (e.g. at 365° C.) will cause the solder to melt and reform in an essentially spherical shape, without evidence of the prior deformation. However, such a reflow process is time consuming and requires a flux material to be applied and removed from the die. If performed at the die level, as opposed to the wafer level, the application and removal of the flux material is quite cumbersome. Furthermore, such a reflow process cannot be used with conductive solder bumps where the lead and tin (or other bump constituents) are not commingled, such as in the case of forming an Extended Evaporated Eutectic (E-3) bump as taught in U.S. Pat. No. 5,470,787 by Greer et al. and assigned to the assignee hereof.

Accordingly, there is a need in the semiconductor industry for a method for testing bumped semiconductor devices without excessively deforming or otherwise damaging the bumps. Furthermore, it is desirable that such a method be cost-effective, be performed with minimal or no additional processing steps, and be extendible as bump dimensions shrink.

BRIEF DESCRIPTION OF THE DRAWINGS

The features and advantages of the present invention will be more clearly understood from the following detailed description taken in conjunction with the accompanying figures where like numerals refer to like and corresponding parts, where elements are not necessarily drawn to scale, and in which.

DETAILED DESCRIPTION OF A PREFERRED EMBODIMENT

Generally, the present invention provides a method for testing bumped semiconductor die without excessively deforming the conductive bumps. In one form, testing is accomplished using a test contactor which includes an elastomeric material which is patterned to include a plurality of openings which corresponds in pattern to the pattern of conductive bumps. The die is positioned next to the test contactor and the two are compressed together. The walls of the openings in the elastomeric material constrain the deformation of the conductive bumps in the X-Y plane due to the lateral pressure which they exert on the sides of the conductive bumps. In a second form, a mechanical standoff limits the extent to which the die and the test contactor can approach, thereby limiting the deformation in the Z-axis. In a third form, both the elastomeric material and the mechanical standoff act to constrain the deformation in the X-, Y-, and Z- axes.

These and other features, and advantages, will be more clearly understood from the following detailed description taken in conjunction with the accompanying drawings. It is important to point out that the illustrations are not necessarily drawn to scale, and that there are likely to be other embodiments of the present invention which are not specifically illustrated.

Figure 1:
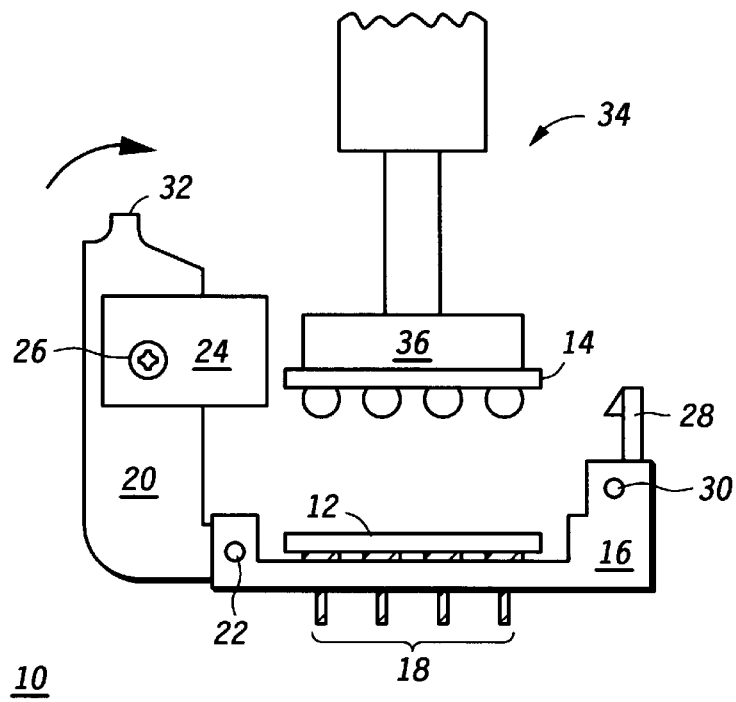
FIG. 1 depicts a partially perspective, partially cross-sectional view of a test socket constructed in accordance with the present invention.

FIG. 1 depicts a partially perspective, partially cross-sectional view of a test socket 10 useful in practicing the present invention. Test socket 10 comprises a test contactor 12 operable to receive and to interconnect a semiconductor substrate, preferably a singulated semiconductor die 14, to test circuitry (not shown). Test socket 10, with test contactor 12, allows die 14 to be fully tested and burned-in prior to sale or further processing. Such a methodology is known as a "Known Good Die" (KGD) process in the semiconductor industry. KGD processes improve the ultimate reliability of end products incorporating die 14. Further, test contactor 12 can test semiconductor devices designed and manufactured with solder bump interconnect technology without damaging the solder bump interconnects themselves. Test contactor 12 incorporates an elastomer/standoff structure (depicted in FIGS. 2 through 4 as deformable layer 204) to assure consistent and controlled bump deformation between test contactor 12 and die 14. Consequently, additional manufacturing steps are not required after test to repair damaged bumps.

Continuing with FIG. 1, test contactor 12 is mounted in a recess of a socket base 16 of test socket 10. A plurality of connector pins 18 extend through socket base 16 to electrically connect an upper surface of test contactor 12 and test circuitry (not shown). The upper surface of test contactor 12 is the surface that receives die 14. A socket lid 20 is pivotally mounted to socket base 16 along an axis 22. A force delivery system 24 is pivotally mounted on socket lid 20 along an axis 26. As used in a socket, force delivery system 24 can be in the form of a calibrated spring, an elastomeric material, an inflatable bladder, or the like. A latch 28 is pivotally mounted to socket base 16 along an axis 30. Latch 28 engages a tab 32 disposed on socket lid 20 when the bulk of socket lid 20 and socket base 16 are aligned parallel to each other during closure. Axes 22, 26 and 30 generally extend into and out of the plane of FIG. 1. However, each may be eccentric to various degrees to maintain final system planarity when socket lid 20 is closed by latch 28 against socket base 16.

A die placement spindle 34 is disposed a bove test socket 10, and in a preferred embodiment is movable along three, mutually perpendicular axes and can be rotated about at least one of these axes. Die placement spindle 34 itself comprises a vacuum pick-up head operable to lift die 14 from a die carrier (not shown), to insert die 14 into test socket 10, and to return die 14 back to the die carrier after test.

In operation, an operator or automated test apparatus (neither shown) first engages die placement spindle 34 to retrieve a die to be tested. Die placement spindle 34 retrieves a die by positioning itself over th e die carrier, by lowering its vacuum pick-up head 36 to contact die 14, and by forming a vacuum between its lower working surface and die 14. Die placement spindle 34 then positions die 14 over test contactor 12 while socket lid 20 is in the open, upright position. Die placement spindle 34 releases die 14 to test contactor 12, and the operator or test apparatus closes socket lid 20 by forcing tab 32 against and under latch 28.

While socket lid 20 is closed against socket base 16, force delivery system 24 exerts a predetermined downward force against the bottom surface of die 14, forcing die 14 against test contactor 12. Such a predetermined pressure creates a predetermined contact resistance. As described below in connection with FIGS. 2–4, test contactor 12 contains an elastomer/standoff structure that permits the solder bump interconnects mounted on die 14 to deform in a controlled and consistent manner. Such a deformation ensures that die 14 is electrically coupled through connector pins 18 to test equipment (not shown). Further, die 14 can be removed from test socket 10 and mounted in a system for ultimate use without further processing or repair.

The test equipment coupled to connector pins 18 applies test signals to die 14 to exercise its functionality in a controlled temperature environment. Typically, the controlled temperature environment ranges from 20° Celsius to 150° Celsius, and more specifically in excess of 70° Celsius. Testing temperatures below 20° Celsius are also possible. In a preferred embodiment, the junction temperature of the active surface of die 14 is controlled to a temperature of 125° Celsius to 150° Celsius. The test equipment can then make a pass/fail decision relating to the performance of die 14.

After test, die placement spindle 34 returns die 14 to the die carrier if die 14 passes its functional test or to a fail bin (not shown) if die 14 fails its functional test.

Figure 2:
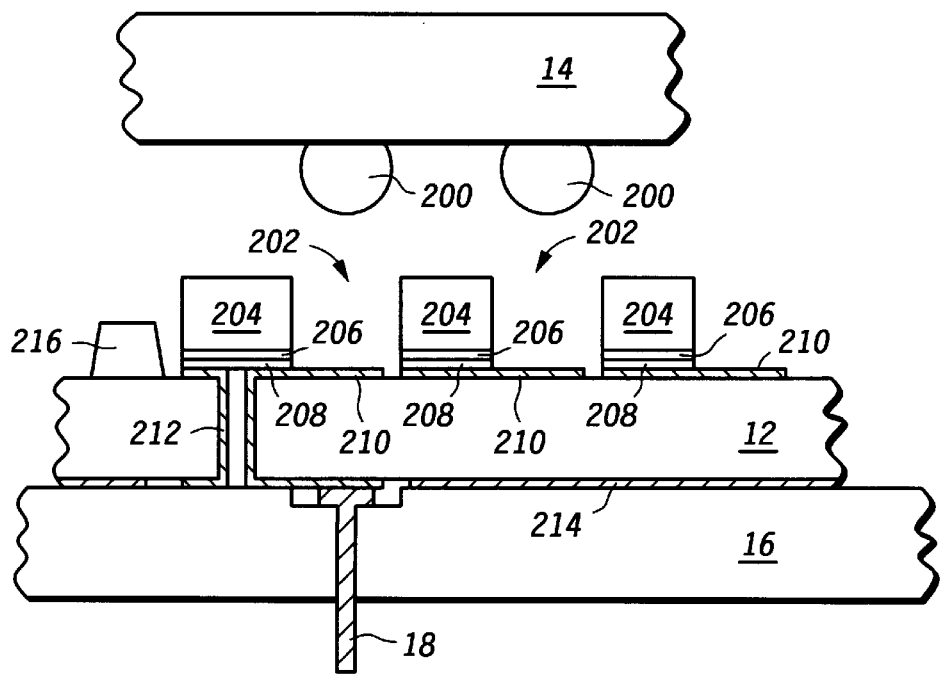
FIG. 2 depicts a first cross-sectional view of a die and a test contactor illustrated in FIG. 1.

FIG. 2 depicts a first cross-sectional view of a portion of die 14 and test contactor 12 illustrated in FIG. 1. FIG. 2 depicts the alignment of die 14 and test contactor 12 immediately prior to placing die 14 into test socket 10. Die 14 contains a plurality of conductive bumps 200 located on its downward facing surface. Conductive bumps 200 can be made of solder, gold, a conductive epoxy, a lead alloy, or the like, and can be formed by selective evaporation, plating, stencil printing, or using a lithographic patterning process. Conversely, test contactor 12 contains a plurality of openings 202 manufactured in an elastically deformable layer 204 aligned to receive conductive bumps 200.

In the preferred embodiment, deformable layer 204 is manufactured from an elastomeric material such as silicone. Deformable layer 204 can be manufactured from other suitable materials, such as polyurethane. Deformable layer 204 is first patterned on a polyimide layer 206 into which openings 202 are also formed. The finished assembly is then glued to test contactor 12 by an adhesive layer 208. In other embodiments, deformable layer 204 can be formed directly on test contactor 12 and then patterned to form openings 202.

Each of the plurality of openings defines a conductive pad 210 coupled to a conductive pin 18 in base 16 of test socket 10 through a plated-through-hole (PTH) 212 in test contactor 12. Although only one conductive pin 18/PTH 212 pair is depicted, each bump 200/conductive pad 210 pair is coupled to a separate conductive pin 18 through a dedicated PTH 212. However, common signals may be combined by test contactor 12 and coupled to a single conductive pin 18. An electrically isolated mechanical support element 214 is formed between test contactor 12 and socket base 16 to assure the planarity of test contactor 12.

Test contactor 12 also contains a mechanical standoff 216 on its upper surface. Mechanical standoff 216 protrudes a predetermined height above the upper surface of test contactor 12 to a plane slightly lower than the top of deformable layer 204. The height of mechanical standoff 216 is preferably 5–25% less than the minimum height of conductive bumps 200. In contrast, the preferred distance from the contact surface of conductive pad 210 to the top surface of deformable layer 204 is 5–25% greater than the minimum height of conductive bumps 200. Consequently, the mechanical stand-off will be shorter than the deformable layer in an uncompressed state.

Mechanical standoff 216 allows force delivery system 24 (depicted in FIG. 1) to compress conductive bumps 200 and deformable layer 204 only to a certain extent. Beyond that extent, mechanical standoff 216 directly touches the surface of die 14, preventing additional closure. In a preferred embodiment, mechanical standoff 216 is formed by the chemical deposition of nickel, e.g. by an electroless plating process. Such a process allows for the precise formation of a desired surface elevation. While only one mechanical standoff feature is depicted, the number of mechanical standoffs is not limited by the present invention. For instance, mechanical standoffs can be situated in any area not occupied or aligned with conductive bumps where their contact to die 14 does not interfere with electrical testing. Furthermore, the invention is not limited to having a mechanical standoff being formed on the test contactor. A mechanical standoff could instead be formed on die 14, or could be a separate piece part which is placed between the die and test contactor to provide the adequate standoff distance.

Figure 3:
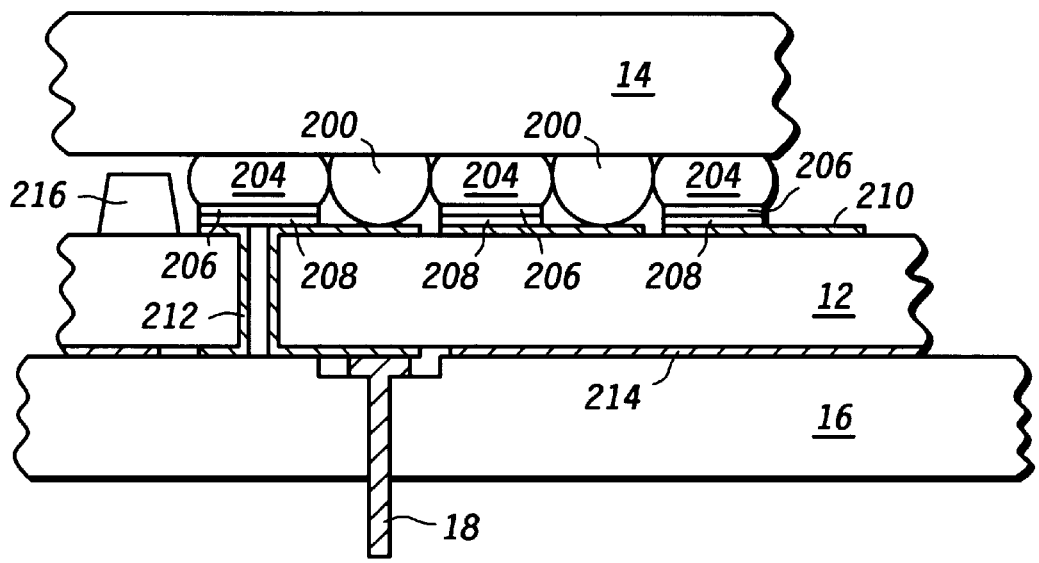
FIG. 3 depicts a second cross-sectional view of the die and the test contactor illustrated in FIG. 1.

FIG. 3 depicts a second cross-sectional view of a portion of die 14 and test contactor 12 illustrated in FIG. 1. FIG. 3 depicts the alignment of die 14 and test contactor 12 immediately after placing die 14 into test socket 10 and applying a downward force by force delivery system 24. As depicted, deformable layer 204 is taller than conductive bumps 200. In response to the applied load (which is preferably a constant load per unit area of the conductive bumps), deformable layer 204 begins to bulge laterally towards conductive bumps 200 before conductive bumps 200 bulge laterally towards the walls of deformable layer 204. Preferably, the deformable layer 204 deforms laterally to make contact around at least a majority of the periphery around each conductive bump 200, and more preferably around the entire periphery. In other embodiments, it may be possible to configure deformable layer 204 to be thinner than or equal to the height of conductive bumps 200. In this case, conductive bumps 200 would laterally deform prior to deformable layer 204.

According to the present invention, early stages of testing die 14 will be conducted while in a state substantially similar to that depicted in FIG. 3. During this state, conductive bumps 200 continue to deform under the action of force delivery system 24 especially at elevated temperatures, typically ranging from 20–150° Celsius. Due to the stress-strain characteristics of soft materials used to manufacture conductive bumps 200, a generally constant interfacial stress will be maintained above the yield value of the material. This interfacial stress determines the contact resistance between conductive bumps 200 and conductive pads 210. The contact resistance can thereby be maintained at an appropriately low level during all phases of testing. Deformation of bump 200 during this testing phase can increase the contact interface area between bump 200 and conductive pad 210, resulting in reduced contact resistance.

Figure 4:
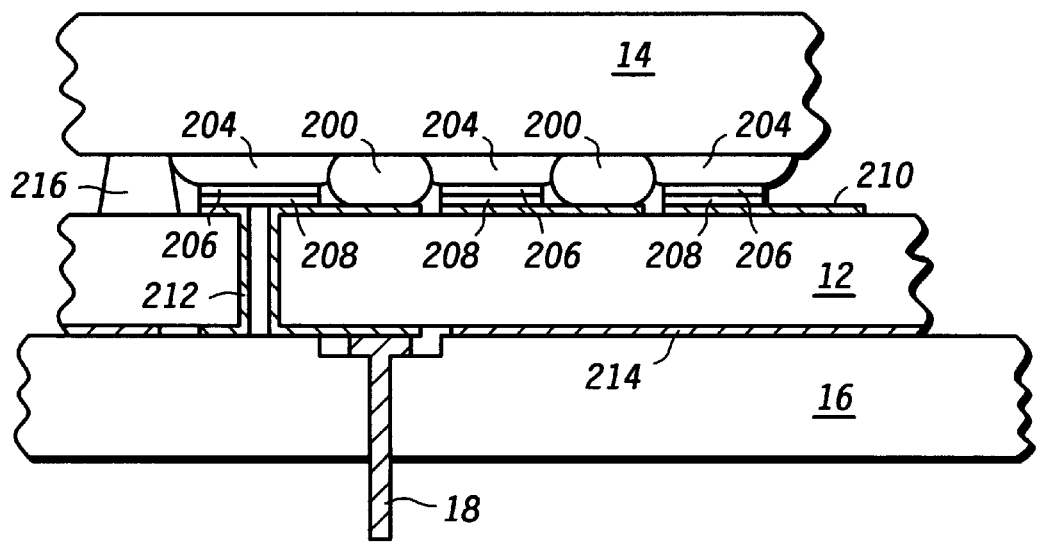
FIG. 4 depicts a third cross-sectional view of the die and the test contactor illustrated in FIG. 1.

FIG. 4 depicts a third cross-sectional view of a portion of die 14 and test contactor 12 illustrated in FIG. 1. FIG. 4 depicts the alignment of die 14 and test contactor 12 after die 14 has been mounted in test socket 10 for a time sufficient to cause standoff 216 to make contact with die 14. From the state depicted in FIG. 3, conductive bumps 200 may continue to deform until mechanical standoff 216 contacts die 14, unless deformable layer 204 fully contacts the periphery of bumps 200 to halt further deformation of bumps 200 due to the essentially incompressible nature of the deformable layer 204 at this stage. Thus, standoff 216 predominantly constrains deformation of conductive bumps 200 in the Z-axis (height), while deformable layer 204 predominantly constrains deformation of conductive bumps 200 in the X-Y plane.

After testing is completed, test socket 10 is opened (e.g. by releasing latch 28 from tab 32 and pivoting lid 20 on axis 22). Upon opening, deformable layer 204 will return to its original shape (e.g. as shown in FIG. 2). Once the deformable layer is disengaged from around conductive bumps 200, die 14 can be removed from test socket 10, for example using the vacuum head 36 of spindle 34. As removed, conductive bumps will not be excessively deformed due to the fact that deformation during testing was controlled by deformable layer 204 and/or standoff 216. Consequently, steps to repair deformation are unnecessary, thereby saving time and cost of manufacturing.

The foregoing description and illustrations contained herein demonstrate many of the advantages associated with the present invention. In particular, it has been revealed that the disclosed invention enables KGD processes to be used with integrated circuits manufactured with conductive bump interconnect technology. The invention provides a controlled and minimal level of bump deformation during testing, without imposing bump rework processes.

Although the invention has been described and illustrated with reference to specific embodiments thereof, it is not intended that the invention be limited to these illustrative embodiments. Those skilled in the art will recognize that modifications and variations can be made without departing from the spirit of the invention. For example, while the disclosed invention has been described with respect to a particular implementation of a test socket 10, the invention can be practiced with different types of test sockets or without any test socket. Furthermore, a test contactor as used in accordance with the invention can be entirely composed of a circuitized elastomeric structure. It is also possible to form connections through a test contactor without the use of plated through-holes as herein described, for example by using buried, blind, and/or filled vias in individual layers of the test contactor. In addition, it is possible to include mechanical standoffs in a test contactor by other means than as illustrated, such as by the use of precisely dimensioned pins which extend through the test contact and the base of a socket. Alternative means to form the mechanical standoff on the test contactor are also contemplated. In another embodiment, the deformable layer may be provided as a separate element which is placed between the mating surfaces before the application of pressure. Further, it is contemplated that rather than, or in addition to, applying a positive pressure to the backside of the die to establish contact, one could apply a negative pressure (e.g. a vacuum) to the front side of the die, using an elastomeric material as a sealing gasket. Therefore, it is intended that this invention encompass all such variations and modifications as fall within the scope of the appended claims.

I claim:

1. A method for testing a bumped semiconductor die comprising:

providing said semiconductor die having active circuitry thereon and a plurality of conductive bumps formed on a surface of the semiconductor die and electrically coupled to the active circuitry;

providing a test contactor having an elastically deformable material formed over a surface thereof, the elastically deformable material having a plurality of openings formed therein, wherein the plurality of openings defines a plurality of conductive pads formed on the surface of the test contactor;

placing the semiconductor die adjacent the test contactor such that the plurality of conductive bumps is aligned with the plurality of openings in the elastically deformable material;

pressing the semiconductor die and the elastically deformable material together to bring the plurality of conductive bumps into contact with the plurality of conductive pads without plastically deforming the elastically deformable material; and testing the active circuitry while the semiconductor die and the test contactor are pressed together.

2. The method of claim 1 wherein the step of pressing further comprises the step of pressing the elastically deformable material together with the semiconductor die such that the elastically deformable material deforms to an extent to make contact with the plurality of conductive bumps.

3. The method of claim 2 wherein during the step of pressing the elastically deformable material deforms to an extent to make contact to a major portion of a periphery of each bump.

4. The method of claim 1 further comprising the step of providing a standoff feature to control an extent of deformation of the plurality of conductive bumps.

5. The method of claim 4 wherein the step of providing said semiconductor die comprises providing a semiconductor die having a plurality of conductive bumps which have a minimum height as measured from an active surface of the semiconductor die, and wherein the standoff feature has a height 5–25% less than the minimum height.

6. The method of claim 4 wherein the step of providing said test contactor comprises providing a test contactor wherein the elastically deformable material has a height in an uncompressed state as measured from a conductive pad surface of the test contactor, and wherein the height of the elastically deformable material is greater than a height of the standoff feature.

7. The method of claim 1 wherein the step of providing said test contactor comprises providing a test contactor wherein the elastically deformable material has a height in an uncompressed state as measured from a conductive pad surface of the test contactor, and wherein the height of the elastically deformable material is greater than a maximum height of the plurality of conductive bumps as measured from an active surface of the semiconductor die.

8. The method of claim 1 wherein the step of providing said semiconductor die comprises providing a semiconductor die in wafer form.

9. The method of claim 1 wherein the step of providing said semiconductor die comprises providing a semiconductor die in singulated die form.

10. The method of claim 1 wherein the step of providing said semiconductor die comprises providing a semiconductor die having a plurality of conductive bumps made from a material selected from a group consisting of: solder, gold, conductive polymer, a lead alloy.

11. The method of claim 1 wherein the step of testing is performed at a junction temperature in excess of 70° C.

12. The method of claim 1 wherein the step of providing said test contactor comprises providing a test contactor wherein the elastically deformable material is an elastomer.

13. A method for testing a bumped semiconductor die comprising:
providing said semiconductor die having active circuitry thereon and a plurality of conductive bumps formed on a surface of the semiconductor die and electrically coupled to the active circuitry;
providing a test contactor having a plurality of conductive pads formed on a surface thereof;
providing a standoff feature;
placing the semiconductor die adjacent the test contactor such that the plurality of conductive bumps is aligned with the plurality of conductive pads of the test contactor and such that the standoff feature is between the semiconductor die and the test contactor;
pressing the semiconductor die against the test contactor under an applied load to bring the plurality of conductive bumps into contact with the plurality of conductive pads; and
testing the active circuitry while the semiconductor die is being pressed against the test contactor, wherein during testing the plurality of conductive bumps deform in response to the applied load and temperature and wherein the standoff feature of the test contactor limits an extent of deformation of the plurality of conductive bumps.

14. The method of claim 13 wherein the step of pressing the semiconductor die against the test contactor under an applied load which is a constant load per unit area of the conductive bumps.

15. The method of claim 13 wherein during the step of testing the standoff feature limits the extent of deformation by controlling a distance between the surface of the semiconductor die and the surface of the test contactor.

16. The method of claim 13 wherein the step of providing said standoff feature comprises providing a standoff feature as an integral part of the test contactor.

17. A method for testing a semiconductor die comprising the steps of:
providing said semiconductor die having a plurality of conductive bumps electrically coupled to active circuitry of the semiconductor die;
providing a test socket;
providing a test contactor having an elastomeric material patterned to include a plurality of openings corresponding in pattern with the plurality of conductive bumps, wherein the plurality of openings define a plurality of conductive pads;
positioning the test contactor within the test socket;
placing the semiconductor die within the test socket such that the plurality of conductive bumps is aligned with the plurality of openings within the elastomeric material;
compressing the semiconductor die and the test contactor together such that the elastomeric material elastically deforms and the plurality of conductive bumps is brought into contact with the plurality of conductive pads; and
testing the active circuitry while the semiconductor die and the test contactor are pressed together.

18. The method of claim 17 wherein the step of providing a test socket comprises providing a hinged test socket, wherein the step of placing comprises placing the semiconductor die in the hinged test socket while the hinged test socket is open, and wherein the step of compressing involves closing the hinged test socket.

19. The method of claim 17 wherein the step of providing said test socket comprises providing a test socket having a plurality of connector pins, and wherein the plurality of conductive pads of the test contactor is electrically coupled to the plurality of connector pins of test socket during testing.

20. The method of claim 17 further comprising the step of providing a standoff feature between the semiconductor die and the test contactor to limit an extent of deformation of the plurality of conductive bumps during testing.

21. The method of claim 20 wherein the step of providing a semiconductor die comprises providing said semiconductor die having said plurality of conductive bumps which have a minimum height as measured from an active surface of the semiconductor die, and wherein the standoff feature has a height which is 5–25% less than the minimum height.

22. The method of claim 20 wherein the step of providing said test contactor comprises providing a test contactor wherein the elastomeric material has a height in an uncompressed state as measured from a conductive pad surface of the test contactor, and wherein the height of the elastomeric material is greater than a height of the standoff feature.

23. The method of claim 17 wherein the step of providing a said test contactor comprises providing a test contactor wherein the elastomeric material has a height in an uncompressed state as measured from a conductive pad surface of the test contactor, and wherein the height of the elastomeric material is greater than a maximum height of the plurality of conductive bumps as measured from a surface of the semiconductor die on which the active circuitry is formed.

24. The method of claim 17 wherein the step of testing is performed at a junction temperature in excess of 70° C.

* * * * *